United States Patent
Jeng

(10) Patent No.: US 6,706,611 B2
(45) Date of Patent: Mar. 16, 2004

(54) METHOD FOR PATTERNING A DUAL DAMASCENE WITH RETROGRADE IMPLANTATION

(75) Inventor: Pei-Ren Jeng, Hsin-Chu (TW)

(73) Assignee: Macronix International Co., Ltd., Hsin-Chu (TW)

( * ) Notice: Subject to any disclaimer, the term of this patent is extended or adjusted under 35 U.S.C. 154(b) by 0 days.

(21) Appl. No.: 09/729,833

(22) Filed: Dec. 6, 2000

(65) Prior Publication Data

US 2002/0068432 A1 Jun. 6, 2002

(51) Int. Cl.⁷ .............................................. H01L 21/76
(52) U.S. Cl. ...................... 438/407; 438/514; 438/526; 438/637; 438/700; 438/705; 438/738
(58) Field of Search ................................ 438/301, 407, 438/705, 738, 526, 282, 514, 637, 700

(56) References Cited

U.S. PATENT DOCUMENTS

| | | | | |
|---|---|---|---|---|
| 6,080,663 A | * | 6/2000 | Chen et al. | ................. 438/637 |
| 6,127,247 A | * | 10/2000 | Wu | ............................... 438/514 |
| 6,207,517 B1 | * | 3/2001 | Muller | ......................... 438/301 |
| 6,207,576 B1 | * | 3/2001 | Wang et al. | ................. 438/706 |
| 6,245,618 B1 | * | 6/2001 | An et al. | ..................... 438/289 |
| 6,372,660 B1 | * | 4/2002 | Jeng | ............................ 438/766 |

* cited by examiner

Primary Examiner—Hsien Ming Lee

(57) ABSTRACT

A substrate is provided, and a dielectric layer is formed, thereon. Then a photoresist layer is formed on the dielectric layer and defined a predetermined region for ion implantation. Next, a dense region of dielectric layer is formed by retrograde implantation with photoresist layer as an ion implanted mask, wherein the dense region is a predetermined region for trench. A hard mask layer is formed on the dielectric layer after the photoresist layer is removed. Afterward forming and defining another photoresist layer on the hard mask layer to expose a partial surface of the hard mask layer as a trench region, wherein the partial surface of the hard mask layer comprises the dense region. Subsequently, an etching process is performed by means of the photoresist layer as the etched mask to etch through the hard mask layer and the dielectric layer until the substrate surface is exposed for patterning the dual damascene.

13 Claims, 7 Drawing Sheets

METHOD FOR PATTERNING A DUAL DAMASCENE WITH RETROGRADE IMPLANTATION

BACKGROUND OF THE INVENTION

1. Field of the Invention

The present invention generally relates to a method for manufacturing the multi-level interconnects of semiconductor devices, and more particularly to form a dual damascene.

2. Description of the Prior Art

Recently, the size of a semiconductor device has been greatly reduced and its structure has highly been integrated. When semiconductor devices of integrated circuits (IC) become highly integrated, the surface of the chips may be not supplied with enough area to make the interconnects. For matching up the requirement of interconnects increase with devices shrinks, many designs of the integrated circuit have to use dual damascene method. Moreover, it is using the three-dimensional structure of multi-level interconnects at present in the deep sub-micron region, and inter-metal dielectric (IMD) as the dielectric material which be used to separate from each of the interconnects. A conducting wire which connects up between the upper and the lower metal layers is called the via plug in semiconductor industry. In general, if an opening which forms in the dielectric layer exposure to devices of the substrate in interconnects, it is called the via hole.

There are two methods for conventional via and interconnect processes, one method is that via and interconnect finish by oneself, wherein the method is that the dielectric is first formed on the metal layer, and then the photoresist layer (PR) is defined on the dielectric, and use the etching process to make the via, and deposit conduction material in the via by means of deposition to finish the via process, then deposit and define metal layer, afterward deposit the dielectric layer whereon. Conventional process forming the metal interconnect is that makes the via and the interconnect by means of two lithography process. Thus, it is need cumbrous steps of deposit and pattern. And yet, it will result in interconnects to be difficult patterned due to the multi layer connect layout is more daedal in the sub-quarter micron.

Hence, damascene interconnect structure is developed at present. According to particular of the process, it will compartmentalize three types, such as the single type, the dual type and the self-aligned type. The damascene is that etch the trench of interconnects in the dielectric, and then fill the metal as interconnect. This method can introduce metal that is difficult etched into the semiconductor without etching in the interconnect process. Therefore, this invention is the best method of the interconnect process in the sub-quarter micron.

Conventional dual damascene include two patterns, one is the deep patterns, that is the via patterns; another is the shallow patterns or the line patterns, that is the trench patterns. Conventional via first process for forming a dual damascene is shown as FIG. 1A to FIG. 1C, first of all, a first dielectric layer 110, an etching stop layer 120 and a second dielectric layer 130 are formed on the substrate 100 in order. Then a first photoresist layer 140 is formed on the second dielectric layer 130, and the first photoresist layer 140 is defined and patterned as a deep pattern area. Next, performing an etching process of the deep patterns by means of the first photoresist layer 140 as a etched mask, and then punching through the second dielectric layer 130, etching stop layer 120 and the first dielectric layer 110, while a via hole 150 is formed. After removing the first photoresist layer 140, a second photoresist layer 160 is formed on the second dielectric layer 130, and it is defined to form a shallow pattern area and expose the partial surface of the via hole 150 and the second dielectric layer 130 so that the horizontal size of the shallow patterns is large more then one of the deep patterns. Afterward performing an etching process of the shallow patterns by means of the second photoresist layer 160 as an etched mask and the etching stop layer 120 as an etching terminal point, so as to remove exposed partial surface of the second dielectric layer 130 and form a trench 170 having large horizontal size. Subsequently, the second photoresist layer 160 is removed to form the opening of the damascene 150 and 170. Final, proceed a interconnect process, since the above processes are well known in the prior art, which are not the focus of the present invention, hence will not be described in greater details.

Likewise, conventional trench first process for forming a dual damascene is shown as FIG. 2A to FIG. 2C, first of all, a first dielectric layer 210, an etching stop layer 220 and a second dielectric layer 230 are formed on the substrate 200 in order. Then a first photoresist layer 240 is formed on the second dielectric layer 230, and then it is defined to form a shallow pattern area and expose the partial surface of the second dielectric layer 230. Next, performing an etching process of the shallow patterns by means of the first photoresist layer 240 as an etched mask and the etching stop layer 220 as an etching terminal point, so as to remove exposed partial surface of the second dielectric layer 230 and form a trench 270. After removing the first photoresist layer 240, a second photoresist layer 260 is formed on the second dielectric layer 230 and the first dielectric layer 210, and then it is defined to form a shallow pattern area and expose the partial surface of the first dielectric layer 210 so that the horizontal size of the shallow patterns is large more then one of the deep patterns. Afterward performing an etching process of the deep patterns by means of the second photoresist layer 260 as an etched mask to form a trench 270 having a smaller horizontal size. Subsequently, the second photoresist layer 260 is removed to form the opening of the damascene 250 and 270. Final, proceed a interconnect process, since the above processes are well known in the prior art, which are not the focus of the present invention, hence will not be described in greater details.

The skill of the dual damascene is a method for forming via and interconnects. In the conventional dual damascene skill of above, in addition to form the dielectric layers with two times of the deposition processes, an etching stop layer has to be formed between two dielectric layers to perform two times of etching process. Therefore, a large fabricated cost is due to the complex step for forming a dual damascene with conventional process. Moreover, performance of device is affected because the addition of etching stop layer makes dielectric constant (K) to raise. Further, there are interface or adherence issues during forming multi-layer with various materials. On the other hand, the process window will be difficult to control after etching process due to the surface for performing the etching process is different.

Moreover, in the via first process, it is necessary that the dielectric layer has enough thickness, so as to avoid damaging semiconductor substrate during over-etching process for forming the via hole, but if the thickness of the dielectric layer is raised, the dielectric constant will be increased, and that device dimension, in sub-micron process, is difficult to be decreased. Hence, a protected layer, such as organic polymer, has to be added on the dielectric before forming the trench. Nevertheless, the organic material is difficult to remove so that process is very hard. Likewise, in the trench first process, there are depth of focus (DOF) issue or critical dimension (CD) issue that is difficult to control.

In accordance with the above description, a new and improved method for patterning the dual damascene is therefore necessary, so as to raise the yield and quality of the follow-up process.

SUMMARY OF THE INVENTION

In accordance with the present invention, a new method for forming dual damascene process is provided that substantially overcomes drawbacks of above mentioned problems arise from the conventional methods.

Accordingly, it is an object of the present invention to provide a new method for forming the dual damascene. In the present invention, the etching process has one time, and that on the same surface, so as to control the process window and avoid the issues, such as DOF or CD. Therefore, the method of the present invention is effective in raising quality of the process.

Another object of the present invention is that provide a new method for patterning the dual damascene. The present invention can form dielectric later with deposition having only one time, and it is unnecessary for forming the etched stop layer, so as to avoid increasing dielectric constant due to increase the thickness of dielectric layer or the addition of the etched stop layer. Accordingly, this invention can raise performance of logic circuit. Furthermore, the present invention can also prevent issues of interface or adherence. Therefore, the present invention can simplify step of process to reduce fabrication cost. Hence, the method of the present invention is easily and to conform to the economic effect.

Still another object of the present invention is that provide a new method for patterning the dual damascene. In this invention, a dense region is formed in the dielectric layer by the retrograde implantation, so as to substitute for the etched mask and the etched stop layer in the conventional process, wherein the dense region in the dielectric layer can change etched rate to make the selective ratio for forming the trench and the via hole, simultaneously. Hence, the method of this invention is suitable for use in the sub micron device.

In accordance with the present invention, a new method for forming the dual damascene is disclosed. In one embodiment of the present invention, first of all, a substrate is provided, and a dielectric layer is formed, thereon. Then a photoresist layer is formed on the dielectric layer and defined a predetermined region for ion implantation. Next, a dense region of dielectric layer is formed by retrograde implantation with photoresist layer as an ion implanted mask, wherein the dense region is a predetermined region for trench. A hard mask layer is formed on the dielectric layer after the photoresist layer is removed. Afterward forming and defining another photoresist layer on the hard mask layer to expose a partial surface of the hard mask layer as a trench region, wherein the partial surface of the hard mask layer comprises the dense region. Subsequently, an etching process is performed by means of the photoresist layer as the etched mask to etch through the hard mask layer and the dielectric layer until the substrate surface is exposed for patterning the dual damascene. Finally, removing the photoresist layer and performing a interconnect process, since the above processes are well known in the prior art, which are not the focus of the present invention, hence will not be described in greater details.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
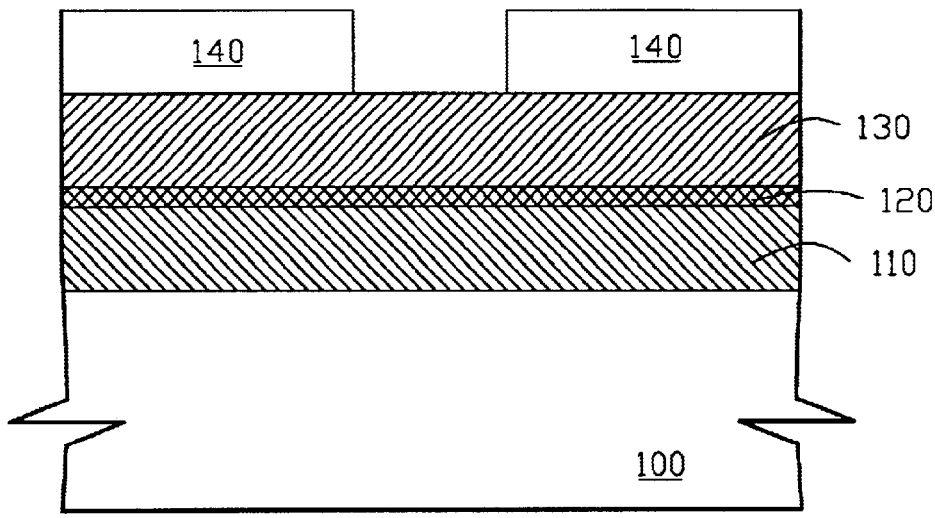
FIGS. 1A to 1C show cross-sectional views illustrative of various stages of conventional via first process in the dual damascene.
Figure 1B:
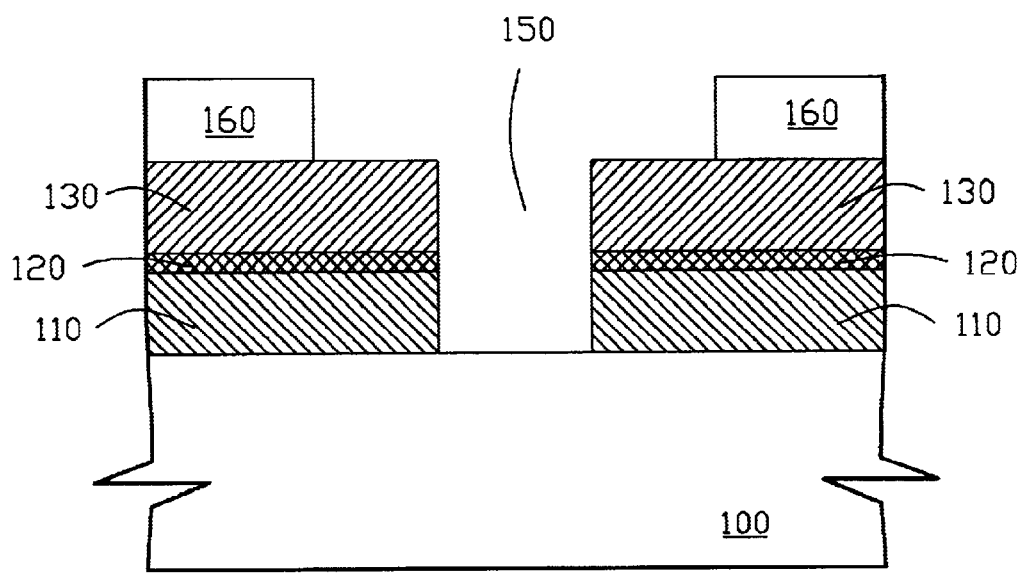
Figure 1C:
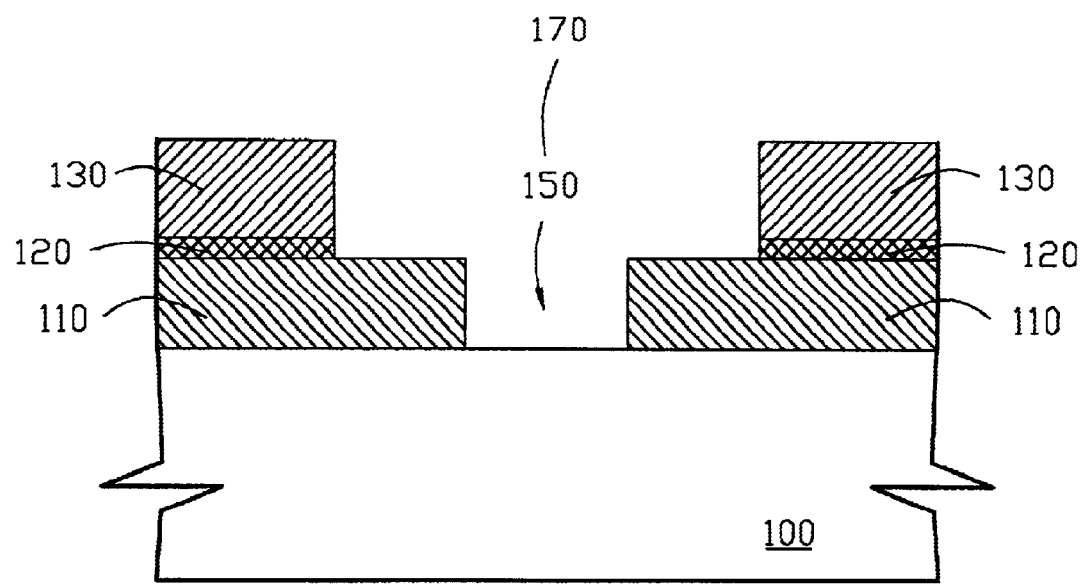
Figure 2A:
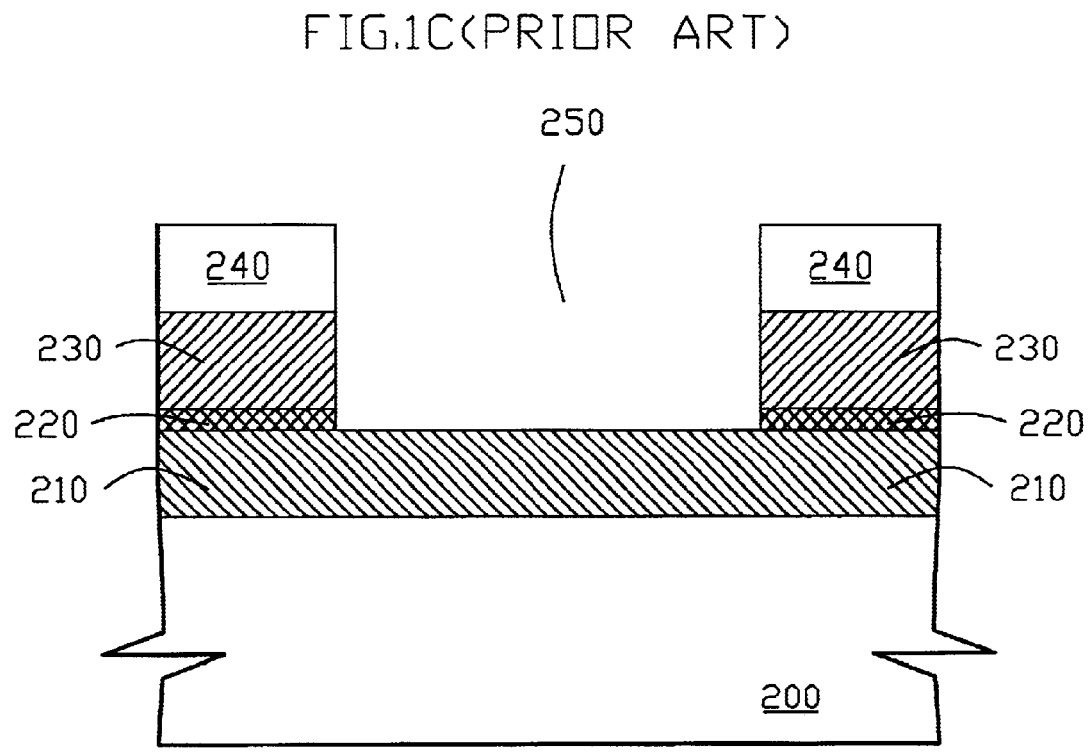
FIGS. 2A to 2C show cross-sectional views illustrative of various stages of conventional trench first process in the dual damascene.
Figure 2B:
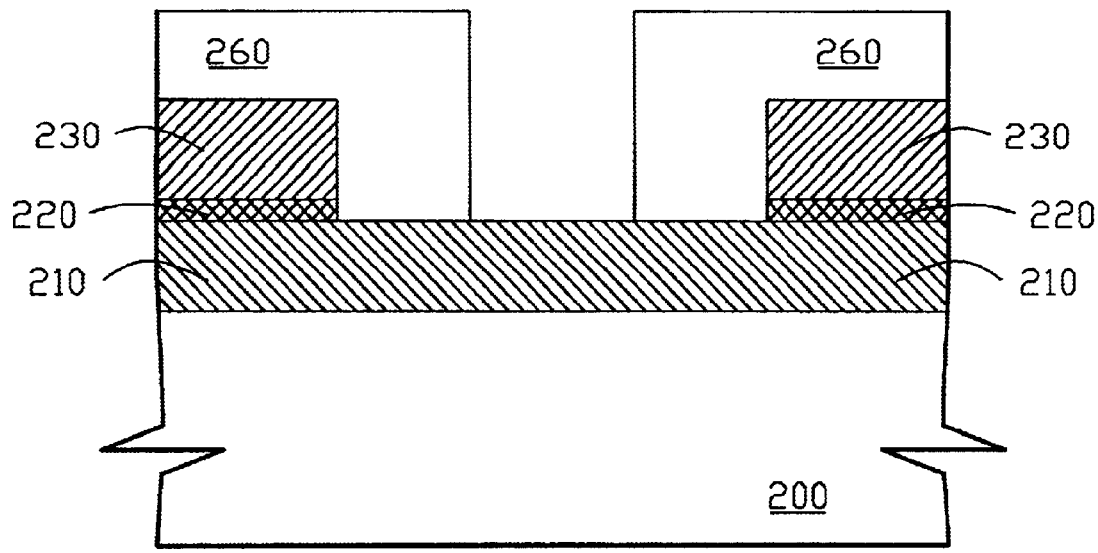
Figure 2C:
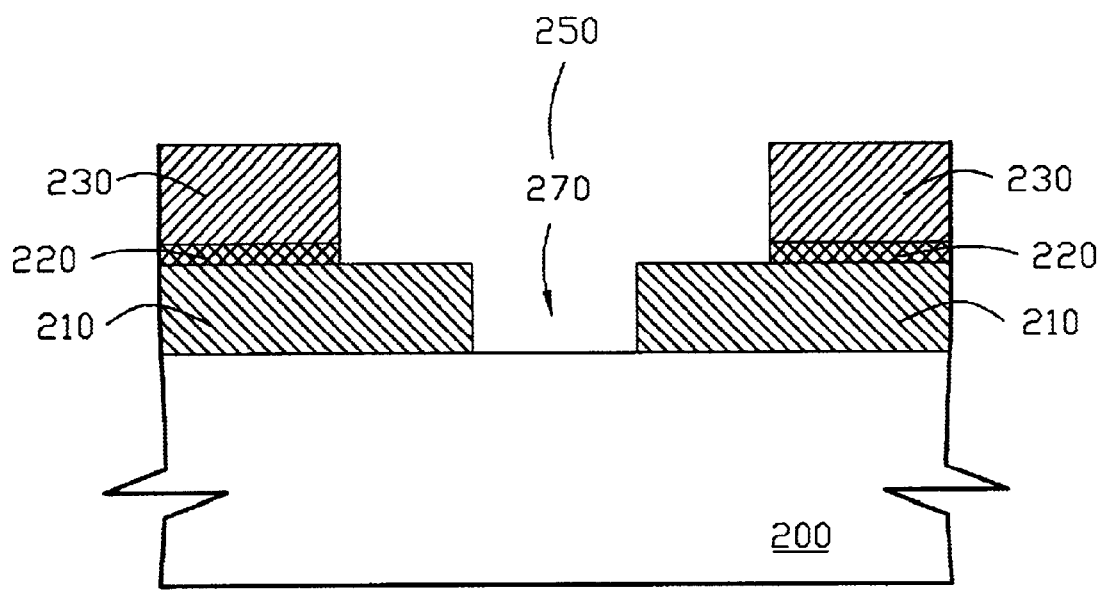
Figure 3A:
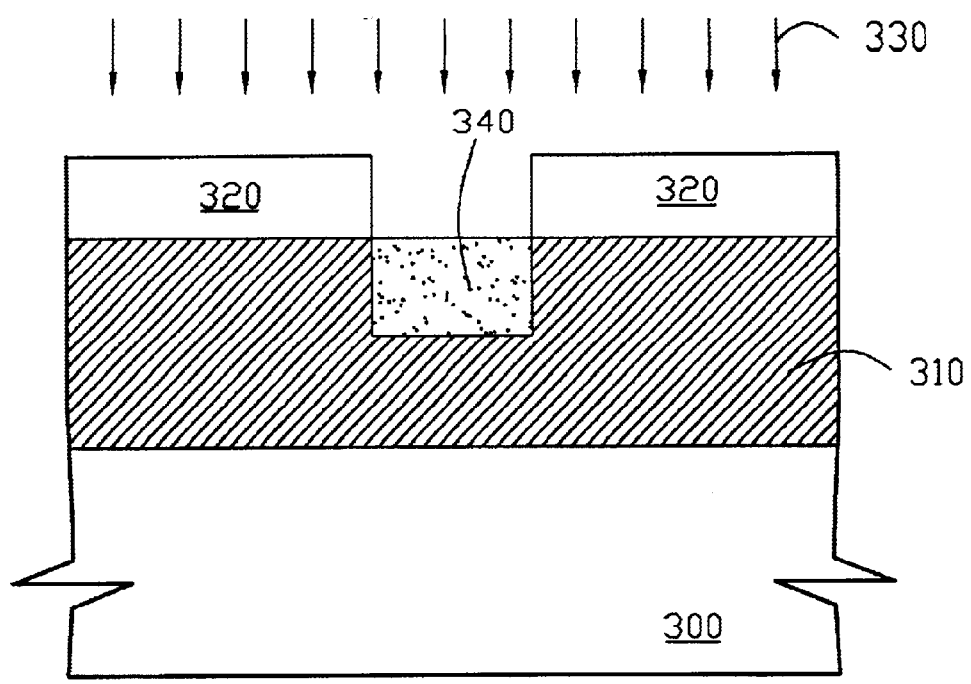
FIGS. 3A and 3B show cross-sectional views illustrative of various stages of the pattern method in the dual damascene in accordance with the first embodiment in this invention.

As illustrated in FIG. 3A, in the first embodiment of the present invention, first of all, a substrate 300 is provided and a dielectric layer 310 is formed over the substrate 300. Then a photoresist layer 320 is formed on the dielectric layer 310 and defined a predetermined region for ion implantation. Next, a uniform dense region 340 is formed in the dielectric layer 310 by a retrograde implantation 330 with the photoresist layer 320 as an ion implanted mask. The retrograde implantation 330 of above, which is a physical method, can bombard material with ions to change the material density, such as the uniform dense region 340, and change the etched rate in follow-up etching process.

Figure 3B:
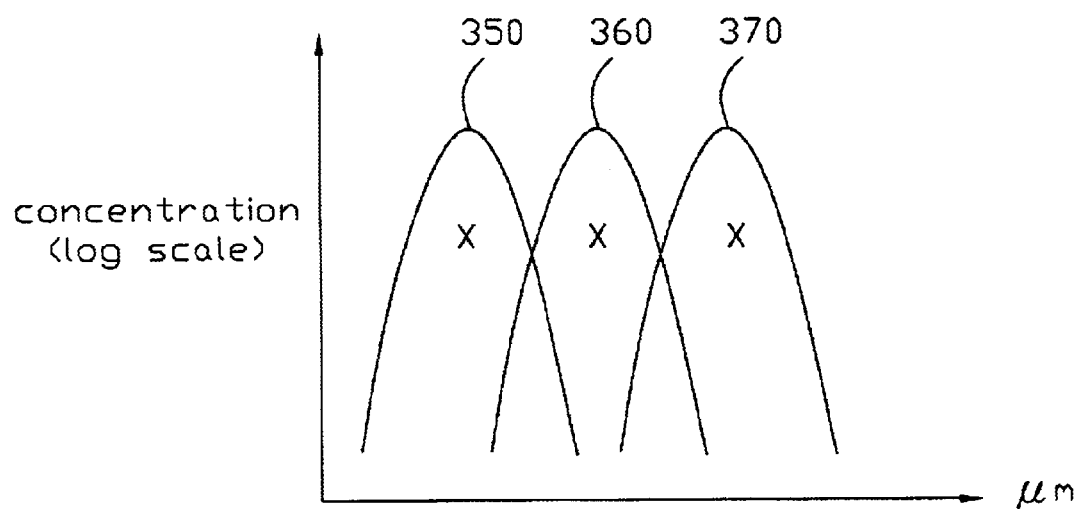

Referring to FIG. 3B, in this embodiment, the retrograde implantation 330 is a multi-ion implantation, such as the first ion implantation 350 is performed by using phosphorous (P) or boron (B) ions, whose dosage is about between $10^{12}$ and $10^{15}$, with energy about between 20 KeV and 100 KeV; the second ion implantation 360 is performed by using phosphorous (P) ions, whose dosage is about between $10^{12}$ and $10^{15}$, with energy about between 350 KeV and 700 KeV; the third ion implantation 370 is performed by using phosphorous (P) ions, whose dosage is about between $10^{12}$ and $10^{14}$, with energy about between 1 MeV and 3 MeV. However, it should be noted that the retrograde implantation 330 is not limited to implement the number of times and the conditions in above specific embodiment.

Figure 4A:
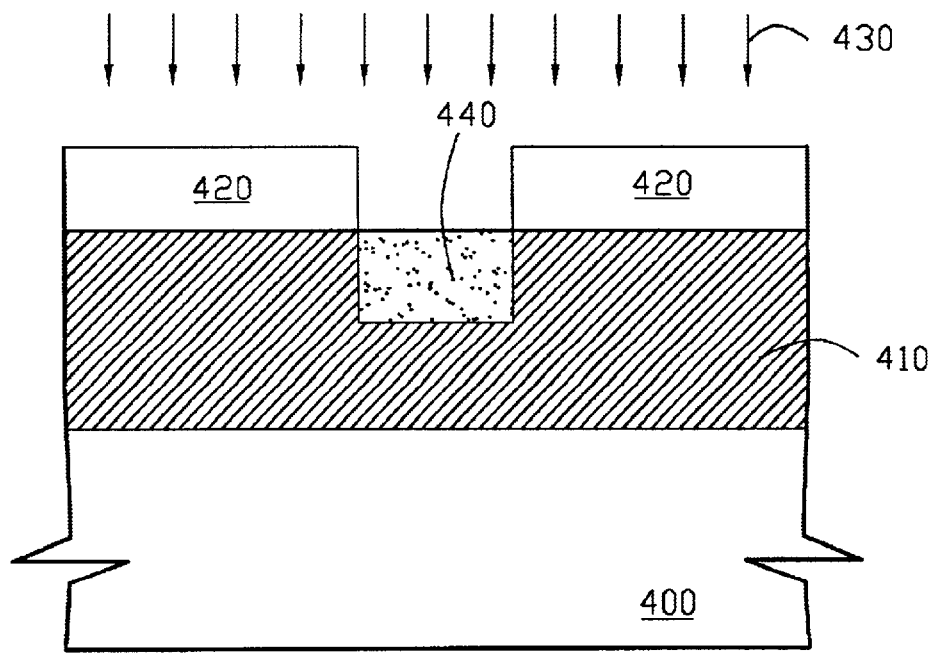
FIGS. 4A to 4C show cross-sectional views illustrative of various stages of the pattern method in the dual damascene in accordance with the second embodiment in this invention.

Referring to FIG. 4A, in the second embodiment of the present invention, first of all, a substrate 400 is provided, and a dielectric layer 410 is deposited, thereon, wherein the batter material of the dielectric layer 410 is a low-K dielectric material. Then a first photoresist layer 420 is formed on the dielectric layer 410 and defined a predetermined region for ion implantation. Next, a uniform dense region 440 as a predetermined trench region is formed in the dielectric layer 410 by retrograde implantation 430 and the first photoresist layer 420 as an ion implanted mask, wherein the uniform dense region 440 will change etched rate during the dielectric layer 410 will be etched, so as to form a via hole and a trench at the same time. The retrograde implantation 430 of above is performed by using three times of the ion implantation, such as the first ion implantation 350 is performed by using phosphorous (P) or boron (B) ions, whose dosage is about between $10^{12}$ and $10^{15}$, with energy about between 20 KeV and 100 KeV; the second ion implantation 360 is performed by using phosphorous (P) ions, whose dosage is about between $10^{12}$ and $10^{15}$, with energy about between 350 KeV and 700 KeV; the third ion implantation 370 is performed by using phosphorous (P) ions, whose dosage is about between $10^{12}$ and $10^{14}$, with energy about between 1 MeV and 3 MeV. However, it should be noted that the retrograde implantation 430 is not limited to implement the number of times and the conditions in above specific embodiment.

Figure 4B:
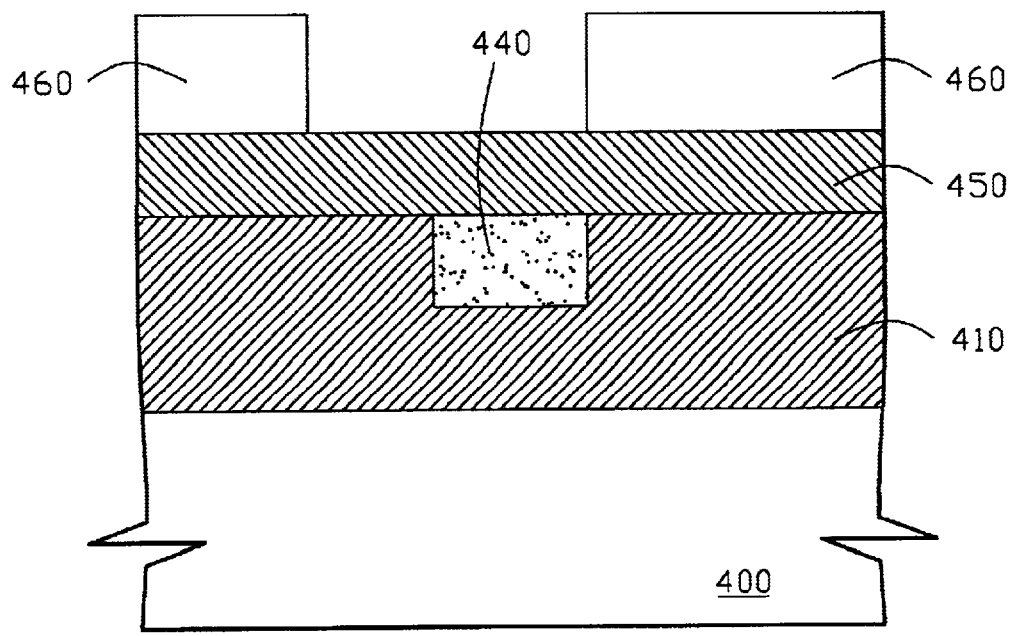
Figure 4C:
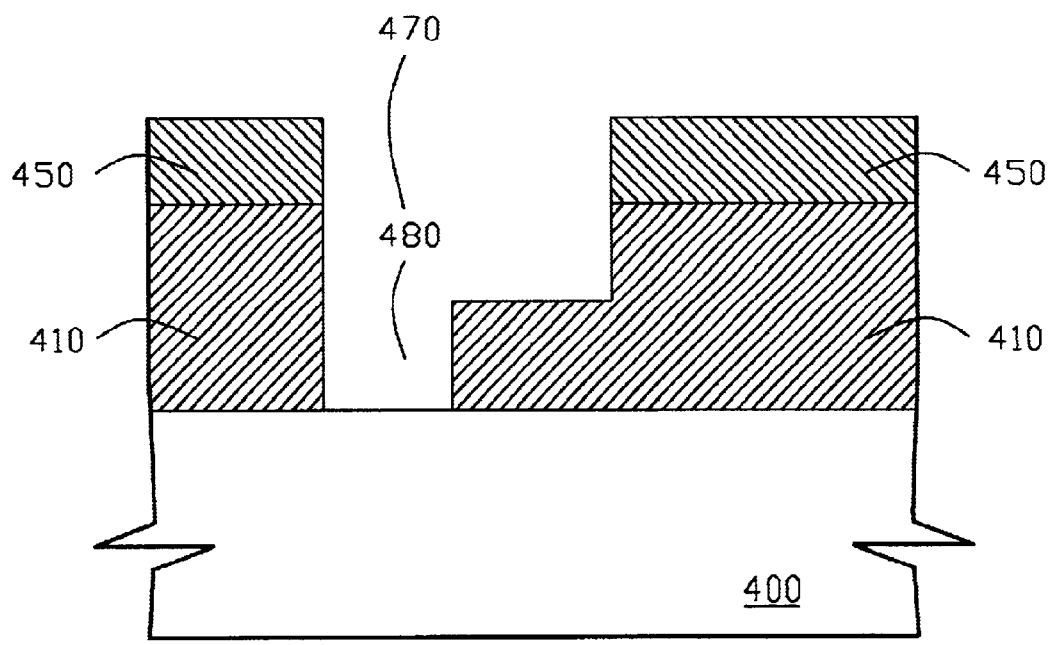

Referring to FIG. 4B, in this embodiment, a hard mask layer 450 is formed on the dielectric layer 410 after the first photoresist layer 420 is removed. Afterward forming and defining the second photoresist layer 460 on the hard mask layer 450 to expose a partial surface of the hard mask layer 450 as a predetermined etched region, wherein the partial surface of the hard mask layer 450 comprises the uniform dense region 440. Subsequently, an etching process is performed by means of the second photoresist layer 460 as an etched mask to etch through the hard mask layer 450 and the dielectric layer 410 until surface of the substrate 400 is exposed for patterning the dual damascene, wherein the etching selectivity between the uniform dense region 440 and the dielectric layer 410 is about 2. Final, removing the second photoresist layer 460 to form a trench 470 and a via hole 480 of the dual damascene, as shown in FIG. 4C.

Figure 5A:
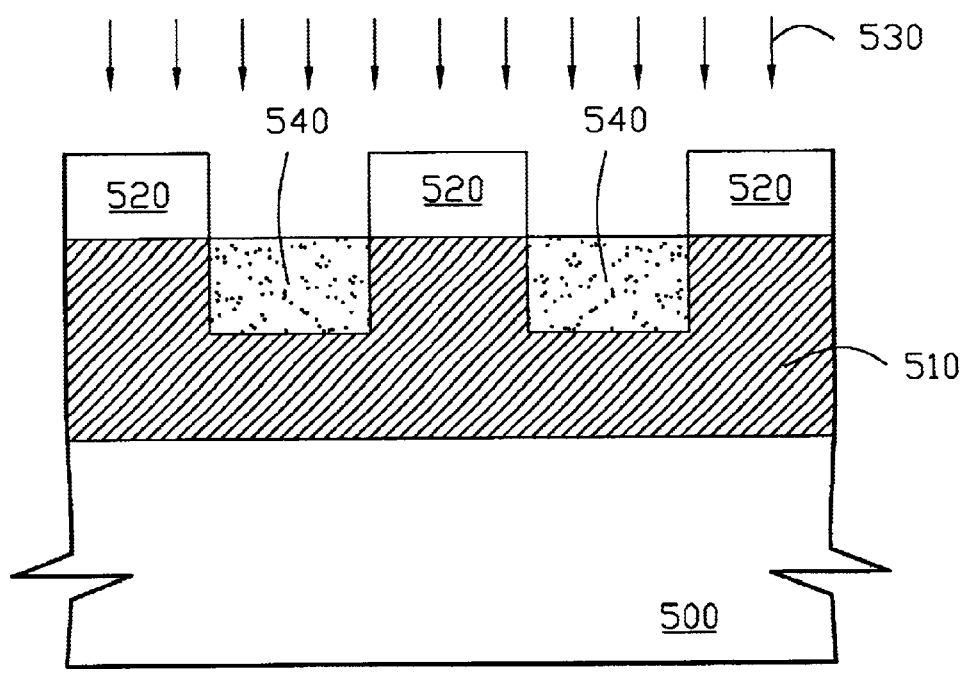
FIGS. 5A to 5C show cross-sectional views illustrative of various stages of the pattern method in the dual damascene in accordance with the third embodiment in this invention.

Referring to FIG. 5A, in the third embodiment of the present invention, first of all, a substrate 500 is provided, and a dielectric layer 510 is formed, thereon. Then a first photoresist layer 520 is formed on the dielectric layer 510 and defined two predetermined regions for ion implantation. Next, two uniform dense regions 540 as a predetermined trench region are formed in the dielectric layer 510 by retrograde implantation 530 and the first photoresist layer 520 as an ion implanted mask, wherein two uniform dense regions 540 will change etched rate during the dielectric layer 510 will be etched, so as to form a via hole and a trench at the same time.

Figure 5B:
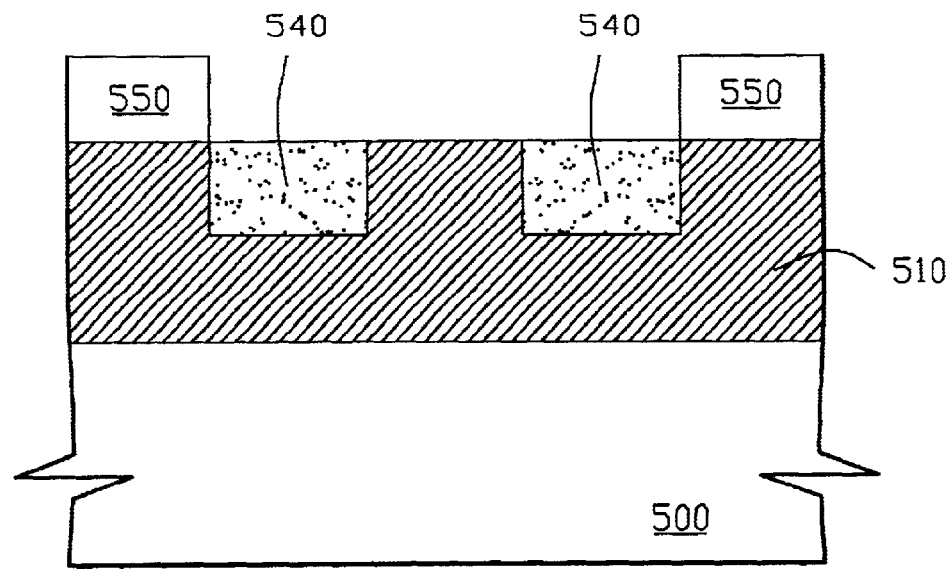
Figure 5C:
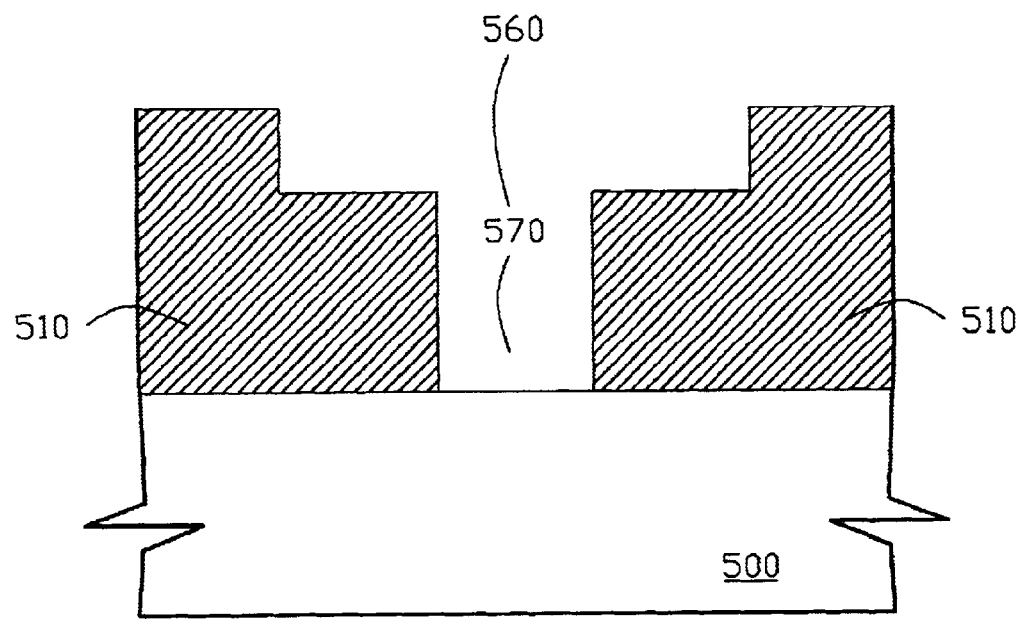

Referring to FIG. 5B, in this embodiment, after the first photoresist layer 520 is removed, a second photoresist layer 550 is formed and defined on the dielectric layer 510 to expose a partial surface of the dielectric layer 510 as a predetermined etched region, wherein the partial surface of the dielectric layer 510 comprises two uniform dense regions 540. Subsequently, an etching process is performed by means of the second photoresist layer 550 as an etched mask to etch through the dielectric layer 510 until surface of the substrate 500 is exposed for patterning the dual damascene. Final, removing the second photoresist layer 550 to form a trench 560 and a via hole 570 of the dual damascene, as shown in FIG. 5C.

In these embodiments of the present invention, a new pattern method of the dual damascene is provided. The present invention uses the etching process with one time on the same surface, so as to control the process window and avoid the issues, such as DOF or CD. Hence, it is effective in raising quality of the process. Furthermore, the present invention can form the dielectric layer with deposition having only one time, and it is unnecessary for forming the etched stop layer, so as to avoid increasing dielectric constant due to increase thickness of the dielectric layer or the addition of the etched stop layer. Accordingly, this invention can raise performance of logic circuit. Moreover, the present invention can also prevent issues of interface or adherence. Therefore, it is possible to provide a highly reliable semiconductor device without the occurrence of deterioration of interconnects quality. Further, the present invention can simplify step of process to reduce fabrication cost. In other words, the method of the present invention is easily and to conform to the economic effect. On the other hand, in this invention, a dense region is formed in the dielectric layer by the retrograde implantation, so as to substitute for the hard mask and the etched stop layer in the conventional process. Thus, the method of this invention is suitable for use in the sub micron devices. Of course, it is possible to apply the present invention to the patterned process in the dual damascene, and also it is possible to the present invention to the nature changed of materials in the semiconductor devices. Also, this invention can be applied to pattern process concerning the dual damascene process used for forming the trench and the via hole at the same time by retrograde implantation have not been developed at present. Method of the present invention is the best low-K dual damascene compatible process for deep sub-micron process.

Obviously, many modifications and variations of the present invention are possible in light of the above teachings. It is therefore to be understand that within the scope of the appended claims, the present invention may be practiced otherwise than as specifically described herein.

Although specific embodiments have been illustrated and described, it will be obvious to those skilled in the art that various modifications may be made without departing from what is intended to be limited solely by the appended claims.

What is claimed is:

1. A method for forming a dual damascene opening, comprising:

providing a substrate with a dielectric layer thereon;

providing a first patterned photoresist on said dielectric layer to expose a first portion of said dielectric layer;

implanting ions into said first portion of said dielectric layer in a depth of part of said dielectric layer under a masking of said first patterned photoresist so as to form a dense region in said first portion or said dielectric layer;

removing said first patterned photoresist;

providing a second patterned photoresist on said dielectric layer, said second patterned photoresist defining an etching opening for exposing at least part of said dense region and a second portion of said dielectric layer;

performing an etching process whose by said second patterned photoresist to etch said dielectric layer under said etching opening until exposing said substrate wherein an etching rate of said dense region is lower than said second portion of said dielectric layer, whereby a trench region is formed in said dense region and a via region is formed in said second portion of said dielectric layer; and removing said second patterned photoresist to form said dual damascene opening having said trench region and said via region.

2. The method according to claim 1 wherein a step of implanting comprises a retrograde implantation.

3. The method according to claim 2, wherein said retrograde implantation comprises:

a first ion implantation process with a first energy between 20 to 100 KeV to form a first ion implantation region in said dielectric layer; and a second ion implantation process with a second energy between 350 to 700 KeV.

4. The method according to claim 2, wherein said retrograde implantation comprises:
   a first ion implantation process with a first energy between 20 to 100 KeV to form a first ion implantation region in said dielectric layer;
   a second ion implantation process with a second energy between 350 to 700 KeV to form a second ion implantation region in said first ion implantation region of said dielectric layer, and
   a third ion implantation process with a third energy between 1 to 3 MeV.

5. The method according to claim 4, wherein said first ion implantation process comprises a first ion with dosage about $10^{12}$ to $10^{15}/cm^2$.

6. The method according to claim 5, wherein said first ion comprises a boron ion.

7. The method according to claim 5, wherein said first ion comprises a phosphorous ion.

8. The method according to claim 4, wherein said second ion implantation process comprises a second ion with dosage about $10^{12}$ to $10^{15}/cm^2$.

9. The method according to claim 8, wherein said second ion comprises a phosphorous ion.

10. The method according to claim 4, wherein said third ion implantation process comprises a third ion with dosage about $10^{12}$ to $10^{14}/cm^2$.

11. The method according to claim 10, wherein said third ion comprises a phosphorous ion.

12. The method according to claim 1, wherein said etching process comprises an etching selectivity between said dense region and said dielectric layer is about 2.

13. The method according to claim 1, further comprising a step for forming a hard mask layer on said dielectric layer.

* * * * *